United States Patent
Ahn

(10) Patent No.: US 8,558,257 B2
(45) Date of Patent: Oct. 15, 2013

(54) COUPLED ASYMMETRIC QUANTUM CONFINEMENT STRUCTURES

(75) Inventor: Doyeol Ahn, Seoul (KR)

(73) Assignee: University of Seoul Industry Cooperation Foundation, Seoul (KR)

( * ) Notice: Subject to any disclaimer, the term of this patent is extended or adjusted under 35 U.S.C. 154(b) by 695 days.

(21) Appl. No.: 12/625,314

(22) Filed: Nov. 24, 2009

(65) Prior Publication Data

US 2011/0121263 A1    May 26, 2011

(51) Int. Cl.
 *H01L 29/20*   (2006.01)
(52) U.S. Cl.
 USPC .............. 257/89; 372/45.01; 372/45.012; 372/50.121; 257/98; 257/14; 257/21; 257/19; 257/81; 257/94; 438/36; 438/32
(58) Field of Classification Search
 USPC .......... 257/89, 14, 21, 19, 81, 94, 98; 438/36, 438/32; 372/45.01, 50.121, 45.012
 See application file for complete search history.

(56) References Cited

U.S. PATENT DOCUMENTS

| | | | |
|---|---|---|---|
| 5,079,774 A | 1/1992 | Mendez et al. | |
| 5,160,992 A | 11/1992 | Gerard et al. | |
| 5,291,034 A | 3/1994 | Allam et al. | |
| 5,574,289 A | 11/1996 | Aoki et al. | |
| 2003/0076865 A1 | 4/2003 | Chang-Hasnain et al. | |
| 2007/0160099 A1 | 7/2007 | Marsh et al. | |

FOREIGN PATENT DOCUMENTS

| | | | |
|---|---|---|---|
| WO | WO 0165308 A1 | 9/2001 | |
| WO | WO 2008046147 A1 | 4/2008 | |

OTHER PUBLICATIONS

Li, J., et al., Voltage-controlled storage and retrieval of an infrared-light pulse in a quantum-dot molecule, Optics Communications, Jun. 15, 2009, pp. 2437-2441, Abstract, p. 2438, Figure 1, vol. 282.

Australian Patent Office, International Search Report and Written Opinion of the International Searching Authority, Feb. 28, 2011, pp. 1-15, Australia.

Yuan, Chun-Hua and Ka-Di Zhu, Voltage-controlled slow light in asymmetry double quantum dots, Applied Physics Letters, 2006, vol. 89, No. 052115, 1-3, United States.

Chang, Shu-Wei, et al, Slow light using excitonic population oscillation, Physical Review B, 2004, vol. 70, No. 235333, pp. 1-11, United States.

Ahn, Doyeol, Theory of Non-Markovian Optical Gain in Quatum-Well Lasers, Progress in Quantum Electronics, 1997, vol. 21, No. 3, pp. 249-287, Great Britain.

Dynes, JF et. al., "Optically mediated coherent population trapping in asymmetric semiconductor quantum wells," Physical Review B, vol. 72, Issue 8, 2005, 1-7, United Kingdom.

*Primary Examiner* — Telly Green
(74) *Attorney, Agent, or Firm* — Cool Patent, P.C.

(57) ABSTRACT

Implementations and techniques for coupled asymmetric quantum confinement structures are generally disclosed.

19 Claims, 5 Drawing Sheets

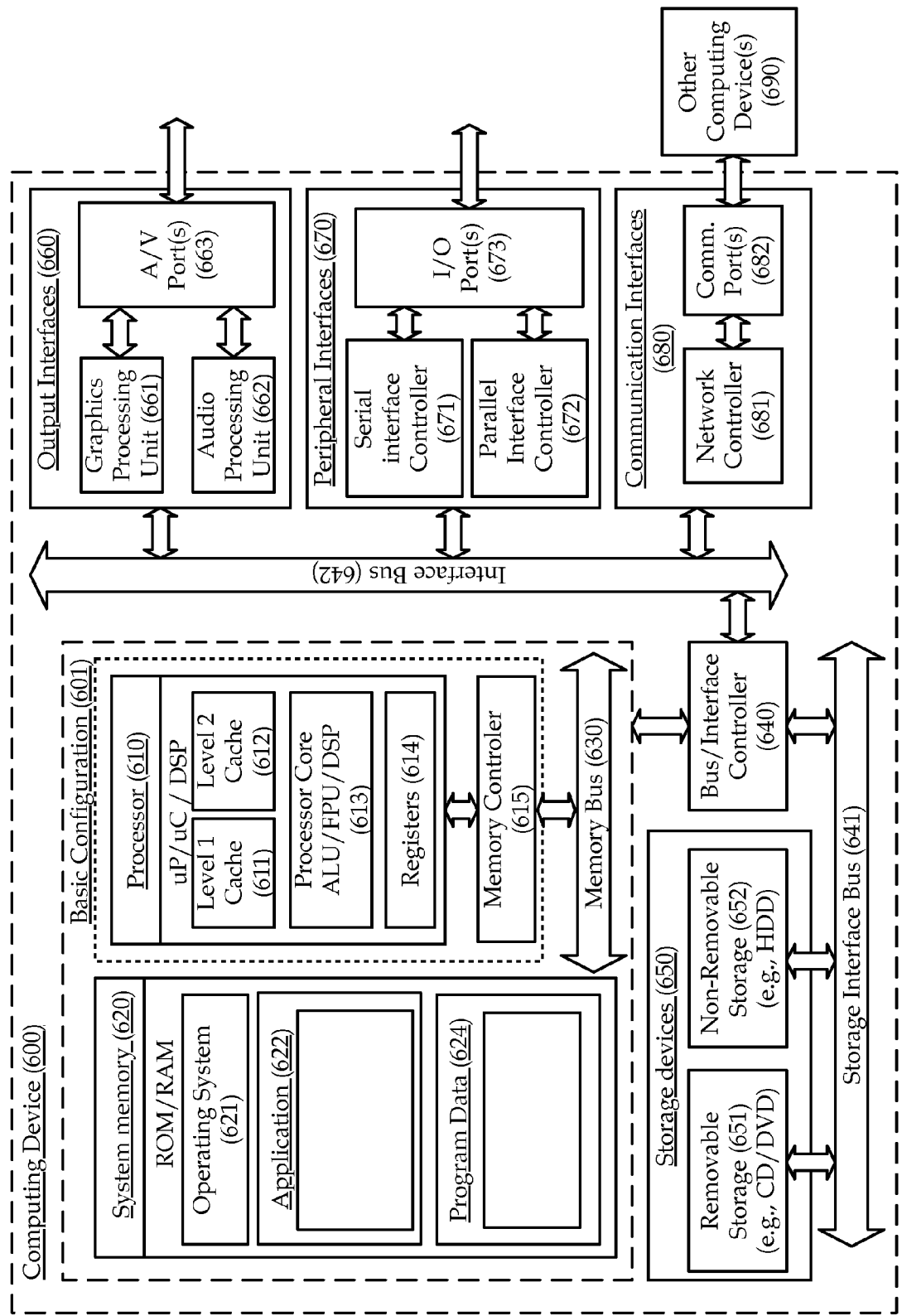

COUPLED ASYMMETRIC QUANTUM CONFINEMENT STRUCTURES

BACKGROUND

Optical delay technologies may be utilized for photonic integrated circuits. Conventional optical delay methods typically use long optical fibers to achieve a desired optical delay.

DETAILED DESCRIPTION

Figure 1:
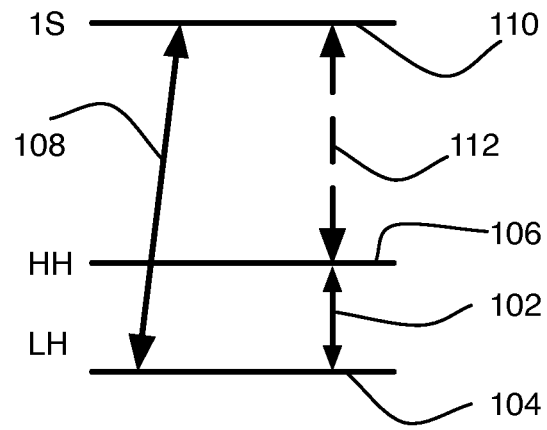
FIG. 1 illustrates a chart of transitions between three energy states associated with a dielectric medium.

The following description sets forth various examples along with specific details to provide a thorough understanding of the claimed subject matter. It will be understood by those skilled in the art, however, that the claimed subject matter may be practiced without some or more of the specific details disclosed herein. Further, in some circumstances, well-known methods, procedures, systems, components and/or circuits have not been described in detail in order to avoid unnecessarily obscuring the claimed subject matter. In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, separated, and designed in a wide variety of different configurations, all of which are explicitly contemplated and make part of this disclosure.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, and so on, may be used to facilitate the discussion of the drawings and are not intended to restrict the application of claimed subject matter. Therefore, the following detailed description is not to be taken in a limiting sense and the scope of claimed subject matter defined by the appended claims and their equivalents.

This disclosure is drawn, inter alia, to methods, apparatus, and systems related to coupled asymmetric quantum confinement structures.

As used herein the term "quantum confinement structure" may refer to a structure capable of quantum confinement, including quantum wells, quantum wires, quantum dots, and/or the like. For example, such a quantum well may refer to a structure capable of confining particles in one spatial dimension, forcing such particles to occupy a planar region. Similarly, such a quantum wire may refer to a structure capable of confining particles in two spatial dimensions, forcing such particles to travel in the transverse direction of the quantum wire. Likewise, such a quantum dot may refer to a structure capable of confining particles in three spatial dimensions. Please note that some examples described herein refer specifically to a quantum well implementation. Where this occurs, it will be understood that examples referring to quantum wells are applicable to quantum confinement structures in general, including quantum wires and/or quantum dots, unless explicitly noted otherwise.

The size of the optoelectronic devices may become reduced in size, so as to operate in a sub-wavelength region of light. In such cases, optoelectronic luminescence and/or light detection efficiency may decrease. For example, dielectric waveguide structures incorporated into optoelectronic devices may be inefficient in a sub-wavelength region. More specifically, a dielectric waveguide structure may have a width of around one micron. However, for optoelectronic devices operating on dimensions in a sub-wavelength region of light, such as devices operating with a waveguide width narrower than about 0.1 microns, a new type of waveguide may be utilized.

For example, tunable optical delay techniques may be utilized for optical buffer applications in photonic integrated circuits. Such a delay of the optical signal may be achieved by reducing the group velocity of light in the transmission medium. The group velocity $V_g$ in a transmission medium may be given by equation 1 below:

$$V_g = \frac{c}{n + \omega \frac{\partial n}{\partial \omega}} \quad \text{(eq. 1)}$$

As illustrated in eq. 1, c may represent the speed of light in a vacuum, n may represent the refractive index of the transmission medium, and ω may represent the angular frequency of the light. In order to slow down the light in a transmission medium, one condition is to have $\partial n/\partial \omega > 0$ at the frequency of the light, indicating a positive slope in the dispersion of the refractive index. For instance, the group velocity $V_g$ of an optical signal may be modified based at least in part on changing the slope of the refractive index. Accordingly, it may be possible to delay an optical signal in a transmission medium. In quantum optics, a positive slope in the dispersion of the refractive index may be achievable via several approaches.

In cases where atoms of the transmission medium have three energy states, either coherent trapping or electromagnetically induced transparency may be utilized by a quantum confinement structure (including quantum wells, quantum wires, quantum dots, and/or the like) to slow down the light in the transmission medium. As used herein, the term "coherent trapping" may refer to coherently controlling the lower two levels of the three energy states to slow down the light in the transmission medium. The term "coherent trapping" may also be referred to as coherent population oscillation. Similarly, as used herein, the term "electromagnetically induced transparency" may refer to coherently controlling the upper two levels of the three energy states to slow down the light in the transmission medium.

FIG. 1 illustrates a chart of transitions between three energy states associated with a dielectric medium, in accordance with at least some embodiments of the present disclosure. In one example, FIG. 1 illustrates coherent trapping, which might be implemented to slow an optical signal in a transmission medium. In such a case, the bottom two levels of a three level energy state system may be controlled to implement such coherent trapping. The ground state of electron in a conduction band is in 1S state and the valence band states may be split into heavy hole (HH) and light hole (LH) states. For example, a transition 102 between a light hole energy level 104 and a heavy hole energy level 106, as well as a transition 108 between light hole energy level 104 and a 1S energy level 110 may be controlled. In such a case, a transition 112 between heavy hole energy level 106 and 1S energy level 110 may be allowed (as indicated by the dashed line). For example, the dipole moment may be related to the average distance between electrons and light holes and heavy holes. As will be discussed in greater detail below, these average distances may be controlled via the physical dimensions of a quantum confinement structure, a gate voltage applied to the quantum confinement structure, and/or the semiconductor materials making up the quantum confinement structure. For example, a quantum mechanical description of coherent trapping may involve a probability amplitude of the occupation of 1S state at time t (110) ($C_a(t)$), a probability amplitude of the occupation of HH state at time t (106) ($C_b(t)$), and a probability amplitude of the occupation of LH state at time t (104) ($C_c(t)$), where initial conditions may be described as: $C_a(0)=0$, $C_b(0)=\cos(\theta/2)$, $C_c(0)=\sin(\theta/2)\exp(-i\psi)$. In such a case, $\theta$ represents the parameter that determines the relative occupancy of levels 106 and 104 and $\psi$ represents the phase difference between two states 106 and 104. Solving the Schrodinger equation yields the following:

$$\frac{dC_a(t)}{dt} = \frac{i}{2}(\Omega_{R1}\exp(-i\phi_1)C_b(t) + \Omega_{R2}\exp(-i\phi_2)C_c(t)) \quad (1)$$

$$\frac{dC_b(t)}{dt} = \frac{i}{2}\Omega_{R1}\exp(i\phi_1)C_b(t) \quad (2)$$

$$\frac{dC_c(t)}{dt} = \frac{i}{2}\Omega_{R2}\exp(i\phi_2)C_c(t) \quad (3)$$

In this example, $\Omega_{R1}\exp(-i\phi_1)$ and $\Omega_{R2}\exp(-i\phi_2)$ represent complex Rabi frequencies associated with the coupling of optical fields 108 and 110 with three level systems, respectively. Such a Rabi frequency may also be proportional to the dipole moment. In this example, the following conditions $\Omega_{R1}=\Omega_{R2}$, $\theta=\pi/2$, and $\phi_1-\phi_2-\psi=\pm\pi$ may be suitable for coherent trapping.

Figure 2:
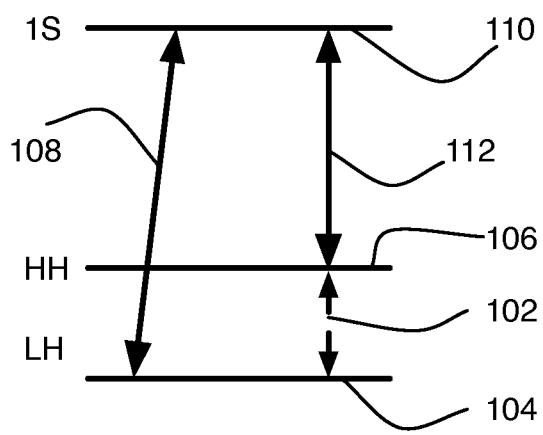
FIG. 2 illustrates a chart of transitions between three energy states associated with a dielectric medium.

FIG. 2 illustrates a chart of transitions between three energy states associated with a dielectric medium, in accordance with at least some embodiments of the present disclosure. In another example, FIG. 2 illustrates electromagnetically induced transparency, which might be implemented to slow an optical signal in a transmission medium. In such a case, the upper two levels of a three level energy state system may be controlled to implement such electromagnetically induced transparency. For example, transition 108 between light hole energy level 104 and 1S energy level 110 may be controlled by transition 112 between heavy hole energy level 106 and 1S energy level 110. In this case, a Rabi frequency of transition 112 may be controlled by an intensity of a driving field. In such a case, transition 102 between light hole energy level 104 and heavy hole energy level 106 may be allowed (as indicated by the dashed line).

Figure 3:
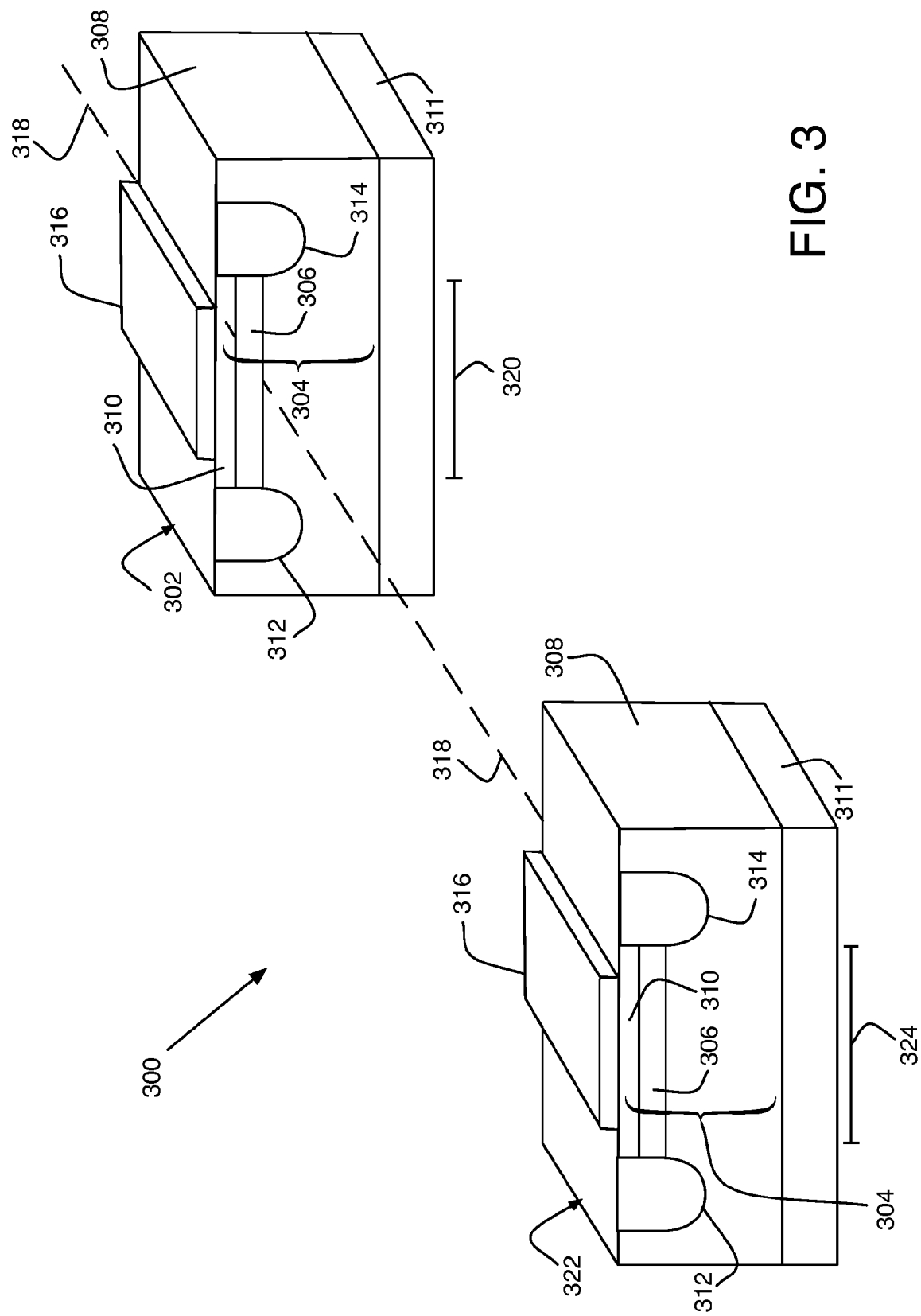
FIG. 3 illustrates a cross-sectional perspective view of a portion of an illustrative embodiment of a coupled asymmetric quantum confinement structure.

FIG. 3 illustrates a cross-sectional perspective view a portion of an illustrative embodiment of a coupled asymmetric quantum confinement structure 300. More particularly, FIG. 3 illustrates example structures for fabricating coupled asymmetric quantum confinement structure 300. FIG. 3 is provided for purposes of illustration and is not intended to depict structures having exact dimensionalities, shapes etc., nor to depict all components or structures that may be present in some implementations but that have been excluded from FIG. 3 to avoid unnecessarily obscuring claimed subject matter.

As illustrated in the example of FIG. 3, a first quantum confinement structure, such as a first quantum well 302 may include a double heterostructure 304 where an inner layer 306 of a first semiconductor material may be sandwiched between two cladding layers 308/310 of a second semiconductor material. For example, one such double heterostructure 304 may include inner layer 306 of a first semiconductor material including gallium arsenide sandwiched between two cladding layers 308/310 of a second semiconductor material including indium gallium arsenide. Such an indium gallium arsenide/gallium arsenide based first quantum well 302 may be suitable for applications near a 1.5 micron frequency optical signal. However, this is merely an example, and other suitable materials and/or frequencies may be utilized with the methods and/or devices disclosed herein. For example, one or more quantum confinement structures may include other suitable materials and/or frequencies including: indium gallium antimonide (InGaSb), which might be suitable for infrared frequency optical signals; indium gallium phosphide (InGaP), which might be suitable for red frequency optical signals; indium gallium nitride (InGaN), which might be suitable for blue frequency optical signals; Group II-VI semiconductors; cadmium zinc oxide (CdZnO), which might be suitable for blue blue-green frequency optical signals; cadmium sulfur selenide (CdSSe), which might be suitable for red to green frequency optical signals; the like, and/or combinations thereof.

Additionally or alternatively, first quantum well 302 may include a substrate 311 on which first cladding layer 308 may be deposited. For example, substrate 311 may include gallium arsenide (GaAs), indium phosphide (InP), gallium nitride (GaN), zinc oxide (ZnO), silicon carbide (SiC), sapphire (Al$_2$O$_3$), silicon (Si(111)), or the like. An n+ region 312 and a p+ region 314 may be formed in first cladding layer 308. N+ region 312 and p+ region 314 may define a p-n junction capable of injecting charge carriers into inner layer 306. A gate electrode 316 may be deposited on second cladding layer 310. In operation, gate electrode 316 may be capable of delivering a gate voltage that may affect the delay of an optical signal 318 operated on by first quantum well 302.

As discussed above, in cases where atoms of the transmission medium have three energy states, either coherent trapping or electromagnetically induced transparency may be utilized by a quantum confinement structure (including quantum wells, quantum wires, quantum dots, and/or the like) to delay optical signal 318. In the case of first quantum well 302, first quantum well 302 may implement coherent trapping to delay optical signal 318. Alternatively, first quantum well 302 may implement electromagnetically induced transparency to delay optical signal 318.

However, due to design constraints, it may be practically difficult to design and/or implement a lone quantum confinement structure capable of influencing a delay and/or frequency of optical signal 318. Accordingly, two or more quantum confinement structure may be coupled in series to operate in conjunction with one another. Such a coupling of two or more quantum confinement structures may permit increased latitude when designing and/or implementing the individual quantum confinement structures. For example, first quantum well 302 may be designed and/or implemented so as to achieve a portion of a desired modification to optical signal 318 (e.g. a modified delay and/or modified frequency), whereas the remainder of such a desired modification may be achieved by a second quantum confinement structure, such as a second quantum well 322 and optional additional quantum confinement structures (not illustrated).

Second quantum well 322 may have some structures similar to or the same as first quantum well 302. In the illustrated example, second quantum well 322 has been enumerated with similar structures as first quantum well 302. First quantum well 302 and second quantum well 322 may be coupled in series to mutually influence optical signal 318. The coupled first and second quantum wells 302 and 322 may be capable of influencing a delay and/or frequency of optical signal 318.

Second quantum well 322 and optional additional quantum wells (not illustrated) may implement the same techniques to delay optical signal 318. For example, in cases where first quantum well 302 may implement coherent trapping to delay optical signal 318, second quantum well 322 and optional additional quantum wells (not illustrated) may also implement coherent trapping. Alternatively, in cases where first quantum well 302 may implement electromagnetically induced transparency to delay optical signal 318, second quantum well 322 and optional additional quantum wells (not illustrated) may also implement electromagnetically induced transparency. Accordingly, first and second quantum wells 302 and 322 may operate as three level energy state systems.

Second quantum well 322 and optional additional quantum wells (not illustrated) may be implemented so as to be asymmetric as compared to first quantum well 302. As used herein, the term "asymmetric" may refer to the physical dimensions of quantum wells 302 and 322, gate voltages applied to quantum wells 302 and 322, and/or the semiconductor materials used in making quantum wells 302 and 322 may impact an implementation of coherent trapping or electromagnetically induced transparency, for example. Accordingly, the physical dimensions of quantum wells 302 and 322, gate voltages applied to quantum wells 302 and 322, and/or the semiconductor materials making up quantum wells 302 and 322 may be capable of influencing a delay and/or frequency of optical signal 318.

In one example, second quantum well 322 may include at least one asymmetric physical dimension as compared to first quantum well 302. For instance, a width 320 associated with first quantum well 302 may be asymmetric as compared to a width 324 associated with second quantum well 322. Such an asymmetric physical dimension may be capable of influencing a delay and/or frequency of optical signal 318. For example, well widths may assist in controlling the refractive index n and angular frequency $\omega$ as well as assist in controlling the slope of the optical absorption $\partial n/\partial \omega$. In such a case, a well width may be utilized to primarily affect the frequency of optical signal 318. Additionally, a well width may be utilized to affect the delay of optical signal 318.

Additionally or alternatively, second quantum well 322 may include at least one asymmetric semiconductor material as compared to first quantum well 302. For instance, inner layer 306, cladding layer 308, and/or cladding layer 310 associated with first quantum well 302 may be asymmetric as compared to inner layer 306, cladding layer 308, and/or cladding layer 310 associated with second quantum well 322. As discussed above, second quantum well 322 and optional additional quantum wells (not illustrated) may be implemented so as to be asymmetric as compared to first quantum well 302. For example, the term "asymmetric" may refer to the semiconductor materials used in making second quantum well 322 being different from at least some of the semiconductor materials used in making first quantum well 302. Such asymmetric semiconductor materials may be capable of influencing a delay and/or frequency of optical signal 318.

Additionally or alternatively, second quantum well 322 may be associated with an asymmetric gate voltage as compared to first quantum well 302. For instance, a gate voltage associated with first quantum well 302 may be asymmetric as compared to a gate voltage associated second quantum well 322. Such an asymmetric a gate voltage may be capable of influencing a delay of optical signal 318. For example, gate voltage may assist in controlling the dipole moment, so adjustment of gate voltage may assist in controlling the slope of the optical absorption $\partial n/\partial \omega$. In such a case, a gate voltage may be utilized to primarily affect the delay of optical signal 318.

Figure 4:
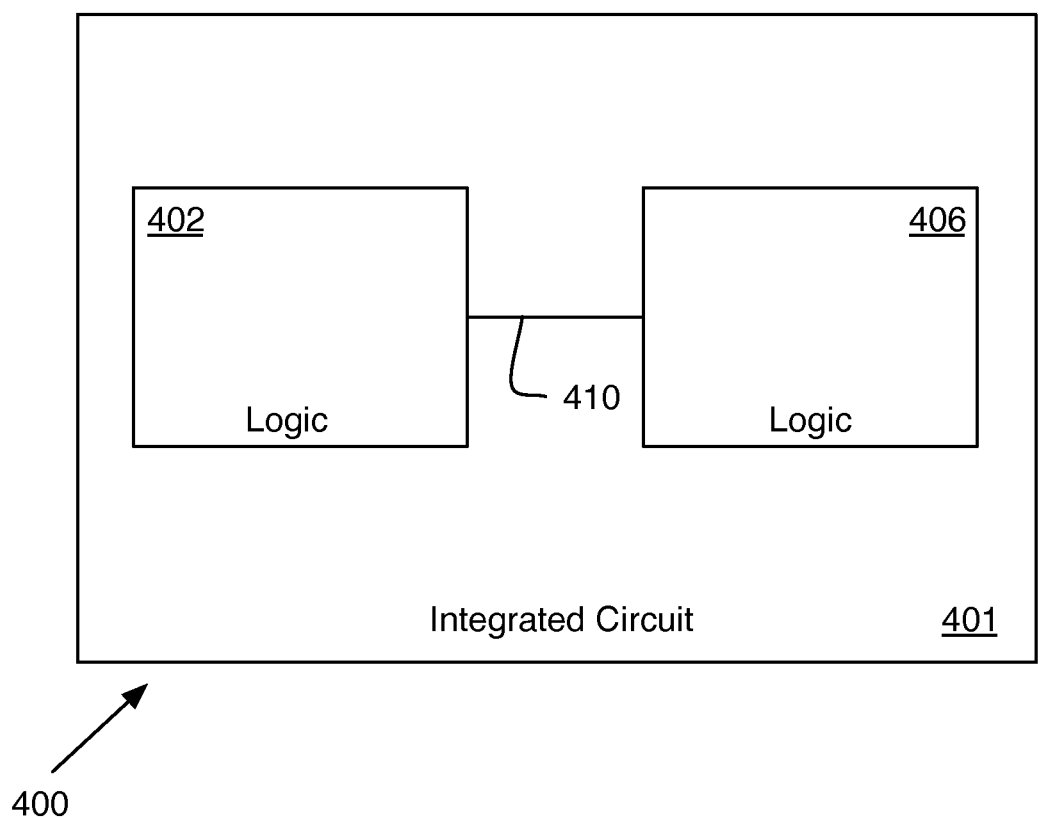
FIG. 4 illustrates an illustrative embodiment of an integrated circuit incorporating a coupled asymmetric quantum confinement structure.

FIG. 4 illustrates a block diagram of a portion of an illustrative embodiment of an integrated circuit (IC) 400, such as a portion of a microprocessor, formed on a substrate 401. IC 400 includes a logic module 402 and another logic module 406. IC 400 also includes a coupled asymmetric quantum confinement structure 410, such as coupled asymmetric quantum confinement structure 300 of FIG. 3, communicatively coupling logic module 402 with logic module 406. Coupled asymmetric quantum confinement structure 410 may be formed using any of the techniques described herein. Coupled asymmetric quantum confinement structure 410 may facilitate optical signal based communications between logic module 402 and logic module 406. Accordingly, IC 400 may include an integrated optical circuit, such as an optical multiplexer, and/or the like.

Figure 5:
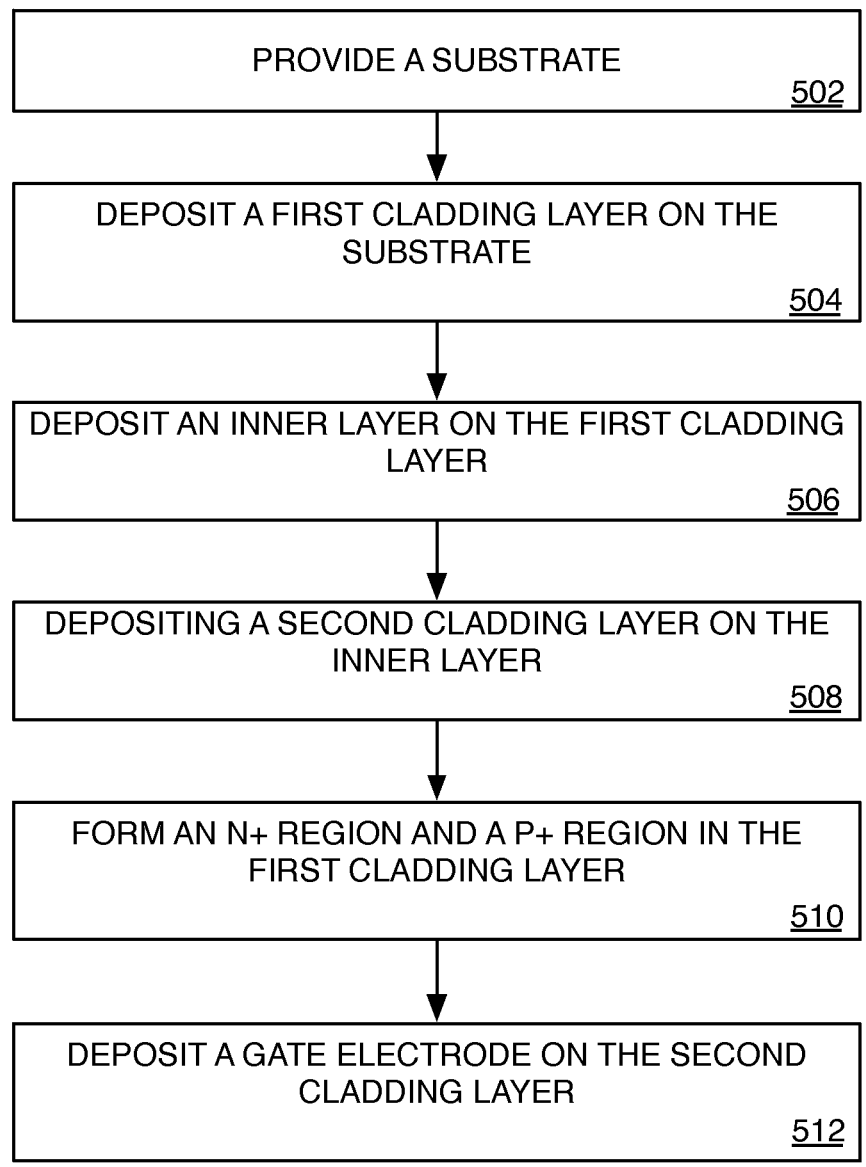
FIG. 5 is a flow diagram of an illustrative embodiment of a process for generating a coupled asymmetric quantum confinement structure.

FIG. 5 is a flow diagram of an illustrative embodiment of a process 500 for generating coupled asymmetric quantum confinement structures. Process 500, and other processes described herein, set forth various functional blocks or actions that may be described as processing steps, functional operations, events and/or acts, etc. Those skilled in the art in light of the present disclosure will recognize that numerous alternatives to the functional blocks shown in FIG. 5 may be practiced in various implementations. For example, although process 500, as shown in FIG. 5, includes one particular order of blocks or actions, the order in which these blocks or actions are presented does not necessarily limit the claimed subject matter to any particular order. Likewise, intervening actions not shown in FIG. 5 and/or additional actions not shown in FIG. 5 may be employed and/or some of the actions shown in FIG. 5 may be eliminated, without departing from the scope of the claimed subject matter.

In block 502, a substrate may be provided. In block 504, a first cladding layer may be deposited on the substrate. The first cladding layer may be deposited via molecular beam epitaxy, chemical vapor deposition, or the like, and/or combinations thereof. In block 506, an inner layer may be deposited on the first cladding layer. The inner layer may be deposited via molecular beam epitaxy, chemical vapor deposition, and/or the like, and/or combinations thereof. In block 508, a second cladding layer may be deposited on the inner layer. The second cladding layer may be deposited via molecular beam epitaxy, chemical vapor deposition, and/or the like, and/or combinations thereof. The inner layer may include a first semiconductor material and the first and second cladding layers may include a second semiconductor material. In an example, a quantum well may include a double heterostructure where an inner layer of a first semiconductor material is sandwiched between two cladding layers of a second semiconductor material. For example, one such double heterostructure may include an inner layer of a first semiconductor material including a gallium arsenide layer sandwiched between two cladding layers of a second semiconductor material including indium gallium arsenide. Such an indium gallium arsenide/gallium arsenide based quantum well may be suitable for applications near a 1.5 micron frequency optical signal. However, this is merely an example, and other suitable materials and/or frequencies may be utilized with the methods and/or devices disclosed herein.

Additionally or alternatively, in block 510, an n+ region and a p+ region may be formed in the first cladding layer. The n+ region and the p+ region may be formed via diffusion, ion implantation, or the like, and/or combinations thereof. The n+ region and the p+ region may define a p-n junction capable of injecting charge carriers into the inner layer. In block 512, a gate electrode may be deposited on the second cladding layer. Such a gate electrode may be composed of materials similar to or different from the inner layer and/or the two cladding layers. In operation, the gate electrode may be capable of delivering a gate voltage that affect the delay of an optical signal operated on by a quantum well.

Process 500 may be utilized to form two or more coupled asymmetric quantum confinement structures (such as quantum wells in the present example) simultaneously. For example, in block 506, an inner layer may be deposited, where a first portion of the inner layer is associated with a first quantum confinement structure and a second portion of the inner layer is associated with a second quantum confinement structure. In such a case, the second portion may include at least one asymmetric physical dimension as compared to the first quantum confinement structure. Alternatively, process 500 may be utilized to form two or more coupled asymmetric quantum confinement structures individually, where such quantum confinement structures may later be associated with one another.

Figure 6:
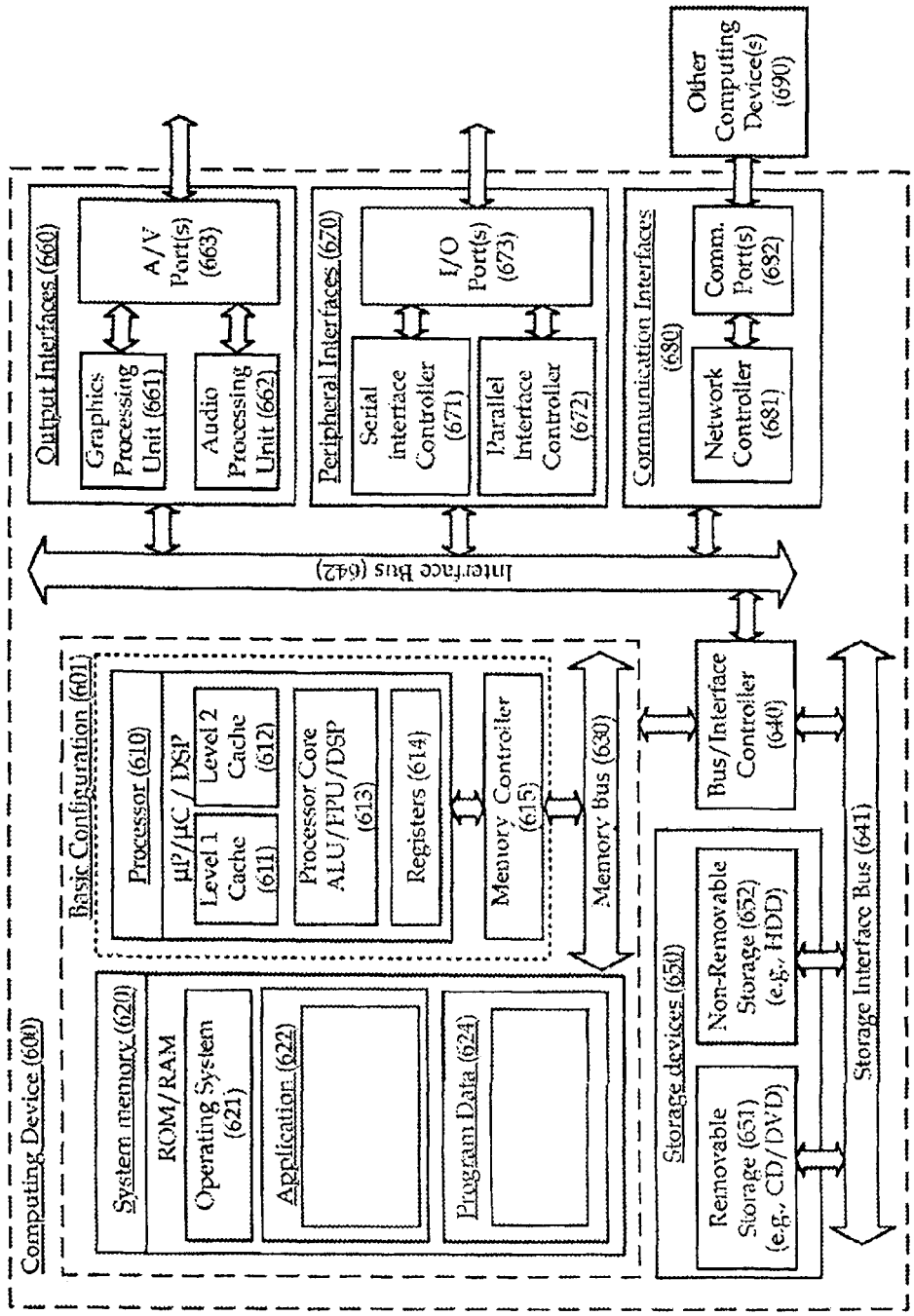
FIG. 6 is a block diagram of an illustrative embodiment of a computing device arranged in accordance with the present disclosure.

FIG. 6 is a block diagram of an illustrative embodiment of a computing device 600 that is arranged to generate coupled asymmetric quantum confinement structures, in accordance with the present disclosure. In one example basic configuration 601, computing device 600 may include one or more processors 610 and a system memory 620. A memory bus 630 can be used for communicating between the processor 610 and the system memory 620.

Depending on the desired configuration, processor 610 may be of any type including but not limited to a microprocessor (µP), a microcontroller (µC), a digital signal processor (DSP), or any combination thereof. Processor 610 can include one or more levels of caching, such as a level one cache 611 and a level two cache 612, a processor core 613, and registers 614. Processor core 613 can include an arithmetic logic unit (ALU), a floating point unit (FPU), a digital signal processing core (DSP Core), or any combination thereof. A memory controller 615 can also be used with processor 610, or in some implementations memory controller 615 can be an internal part of processor 610.

Depending on the desired configuration, system memory 620 may be of any type including but not limited to volatile memory (such as RAM), non-volatile memory (such as ROM, flash memory, etc.) or any combination thereof. System memory 620 may include an operating system 621, one or more applications 622, and program data 624. In some example embodiments, application 622 may be arranged to operate with program data 624 on an operating system to generate coupled asymmetric quantum confinement structures, for example, as described above with respect to process 500 of FIG. 5. This described basic configuration is illustrated in FIG. 6 by those components within the dashed line enclosing basic configuration 601.

Computing device 600 may have additional features or functionality, and additional interfaces to facilitate communications between basic configuration 601 and any required devices and interfaces. For example, a bus/interface controller 640 may be used to facilitate communications between basic configuration 601 and one or more data storage devices 650 via a storage interface bus 641. Data storage devices 650 may be removable storage devices 651, non-removable storage devices 652, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 620, removable storage 651 and non-removable storage 652 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 600. Any such computer storage media may be part of device 600.

Computing device 600 may also include an interface bus 642 for facilitating communication from various interface devices (e.g., output interfaces, peripheral interfaces, and communication interfaces) to basic configuration 601 via bus/interface controller 640. Example output interfaces 660 may include a graphics processing unit 661 and an audio processing unit 662, which may be configured to communicate to various external devices such as a display or speakers via one or more A/V ports 663. Example peripheral interfaces 670 may include a serial interface controller 671 or a parallel interface controller 672, which may be configured to communicate with external devices such as input devices (e.g., keyboard, mouse, pen, voice input device, touch input device, etc.) or other peripheral devices (e.g., printer, scanner, etc.) via one or more I/O ports 673. An example communication interface 680 includes a network controller 681, which may be arranged to facilitate communications with one or more other computing devices 690 over a network communication via one or more communication ports 682. A communication connection is one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), infrared (IR) and other wireless media. The term computer readable media as used herein may include both storage media and communication media.

Computing device 600 may be implemented as a portion of a small-form factor portable (or mobile) electronic device such as a cell phone, a personal data assistant (PDA), a personal media player device, a wireless web-watch device, a personal headset device, an application specific device, or a hybrid device that includes any of the above functions. Computing device 600 may also be implemented as a personal computer including both laptop computer and non-laptop computer configurations. In addition, computing device 600 may be implemented as part of a wireless base station or other wireless system or device.

Computing device 600 may include a coupled asymmetric quantum confinement structure, such as coupled asymmetric quantum confinement structure 300 of FIG. 3. As discussed above, with respect to FIG. 4, integrated circuit 400 may include coupled asymmetric quantum confinement structure 410. Accordingly, computing device 600 may include coupled asymmetric quantum confinement structure circuit 400 incorporated in one or more components, such as processor 610, system memory 620, and/or the like, and/or combinations thereof.

Some portions of the foregoing detailed description are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is here, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing device, that manipulates or transforms data represented as physical electronic or magnetic quantities within memories, registers, or other information storage devices, transmission devices, or display devices of the computing device.

Claimed subject matter is not limited in scope to the particular implementations described herein. For example, some implementations may be in hardware, such as employed to operate on a device or combination of devices, for example, whereas other implementations may be in software and/or firmware. Likewise, although claimed subject matter is not limited in scope in this respect, some implementations may include one or more articles, such as a signal bearing medium, a storage medium and/or storage media. This storage media, such as CD-ROMs, computer disks, flash memory, or the like, for example, may have instructions stored thereon, that, when executed by a computing device, such as a computing system, computing platform, or other system, for example, may result in execution of a processor in accordance with claimed subject matter, such as one of the implementations previously described, for example. As one possibility, a computing device may include one or more processing units or processors, one or more input/output devices, such as a display, a keyboard and/or a mouse, and one or more memories, such as static random access memory, dynamic random access memory, flash memory, and/or a hard drive.

There is little distinction left between hardware and software implementations of aspects of systems; the use of hardware or software is generally (but not always, in that in certain contexts the choice between hardware and software can become significant) a design choice representing cost vs. efficiency tradeoffs. There are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a flexible disk, a hard disk drive (HDD), a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Reference in the specification to "an implementation," "one implementation," "some implementations," or "other implementations" may mean that a particular feature, structure, or characteristic described in connection with one or more implementations may be included in at least some implementations, but not necessarily in all implementations. The various appearances of "an implementation," "one implementation," or "some implementations" in the preceding description are not necessarily all referring to the same implementations.

While certain exemplary techniques have been described and shown herein using various methods and systems, it should be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed:

1. A coupled asymmetric quantum confinement structure operable to delay an optical signal, the coupled asymmetric quantum confinement structure comprising:

a first quantum confinement structure comprising a first cladding layer, an inner layer formed on the first cladding layer, a second cladding layer formed on the inner layer, an n+ region and a p+ region formed in the first cladding layer, and a first gate electrode formed on the second cladding layer, the n+ and the p+ regions to inject charge carriers into the inner layer and the first gate electrode being configured to deliver a first gate voltage; and a second quantum confinement structure coupled in series with the first quantum confinement structure, the second quantum confinement structure comprising a first cladding layer, an inner layer formed on the first cladding layer, a second cladding layer formed on the inner layer, an n+ region and a p+ region formed in the first cladding layer, and a second gate electrode formed on the second cladding layer, the n+ and the p+ regions to inject charge carriers into the inner layer and the second gate being configured to deliver a second gate voltage, wherein the second quantum confinement structure comprises at least one asymmetric physical dimension as compared to the first quantum confinement structure, wherein the coupled first and second quantum confinement structures delay the optical signal by quantum confinement of the optical signal at the first quantum confinement structure in response to the first gate voltage or at the second quantum confinement structure in response to the second gate voltage.

2. The coupled asymmetric quantum confinement structure of claim 1, further comprising one or more additional quantum confinement structures coupled in series with the first quantum confinement structure.

3. The coupled asymmetric quantum confinement structure of claim 1, wherein the first and second quantum confinement structures comprise three level energy state systems.

4. The coupled asymmetric quantum confinement structure of claim 1, wherein the asymmetric physical dimension influences delay of the optical signal.

5. The coupled asymmetric quantum confinement structure of claim 1, wherein the second quantum confinement structure comprises at least one asymmetric semiconductor material as compared to the first quantum confinement structure.

6. The coupled asymmetric quantum confinement structure of claim 1, wherein the second quantum confinement structure comprises at least one asymmetric semiconductor material as compared to the first quantum confinement structure, and wherein the asymmetric semiconductor material influences delay of the optical signal.

7. The coupled asymmetric quantum confinement structure of claim 1, wherein the first and second quantum confinement structures comprise one of first and second quantum wells, first and second quantum wires, or first and second quantum dots.

8. The coupled asymmetric quantum confinement structure of claim 1, wherein the second gate voltage is asymmetric as compared to the first gate voltage, and wherein the asymmetric gate voltage influences delay of the optical signal.

9. The coupled asymmetric quantum confinement structure of claim 4, wherein the second quantum confinement structure comprises at least one asymmetric semiconductor material as compared to the first quantum confinement structure, and wherein the asymmetric semiconductor material influences delay of the optical signal.

10. A coupled asymmetric quantum confinement structure operable to delay an optical signal, the coupled asymmetric quantum confinement structure comprising:

a first quantum confinement structure comprising a first cladding layer, an inner layer formed on the first cladding layer, a second cladding layer formed on the inner layer, an n+ region and a p+ region formed in the first cladding layer, and a first gate electrode formed on the second cladding layer, the n+ and the p+ regions to inject charge carriers into the inner layer and the first gate electrode being configured to deliver a first gate voltage; and a second quantum confinement structure coupled in series with the first quantum confinement structure, the second quantum confinement structure comprising a first cladding layer, an inner layer formed on the first cladding layer, a second cladding layer formed on the inner layer, an n+ region and a p+ region formed in the first cladding layer, and a second gate electrode formed on the second cladding layer, the n+ and the p+ regions to inject charge carriers into the inner layer and the second gate being configured to deliver a second gate voltage, wherein the second quantum confinement structure comprises at least one asymmetric semiconductor material as compared to the first quantum confinement structure, wherein the coupled first and second quantum confinement structures delay the optical signal by quantum confinement of the optical signal at the first quantum confinement structure in response to the first gate voltage or at the second quantum confinement structure in response to the second gate voltage.

11. The coupled asymmetric quantum confinement structure of claim 10, further comprising one or more additional quantum confinement structures coupled in series with the first quantum confinement structure.

12. The coupled asymmetric quantum confinement structure of claim 10, wherein the first and second quantum confinement structures comprise three level energy state systems.

13. The coupled asymmetric quantum confinement structure of claim 10, wherein the asymmetric semiconductor material influences delay of the optical signal.

14. The coupled asymmetric quantum confinement structure of claim 10, wherein the second gate voltage is asymmetric as compared to the first gate voltage, and wherein the asymmetric gate voltage influences delay of the optical signal.

15. The coupled asymmetric quantum confinement structure of claim 10, wherein the first and second quantum confinement structures comprise one of first and second quantum wells, first and second quantum wires, or first and second quantum dots.

16. A coupled asymmetric quantum confinement structure operable to delay an optical signal, the coupled asymmetric quantum confinement structure comprising:

a first quantum confinement structure comprising a first cladding layer, an inner layer formed on the first cladding layer, a second cladding layer formed on the inner layer, an n+ region and a p+ region formed in the first cladding layer, and a first gate electrode formed on the second cladding layer, the n+ and the p+ regions to inject charge carriers into the inner layer and the first gate electrode being configured to deliver a first gate voltage; and a second quantum confinement structure comprising a first cladding layer, an inner layer formed on the first cladding layer, a second cladding layer formed on the inner layer, an n+ region and a p+ region formed in the first cladding layer, and a second gate electrode formed on the second cladding layer, the n+ and the p+ regions to inject charge carriers into the inner layer and the second gate being configured to deliver a second gate voltage, the second quantum confinement structure being coupled in series with the first quantum confinement structure, wherein the second gate voltage is asymmetric as compared to the first gate voltage, wherein the coupled first and second quantum confinement structures delay the optical signal by quantum confinement of the optical signal at the first quantum confinement structure in response to the first gate voltage or at the second quantum confinement structure in response to the second gate voltage.

17. The coupled asymmetric quantum confinement structure of claim 16, further comprising one or more additional quantum confinement structures coupled in series with the first quantum confinement structure.

18. The coupled asymmetric quantum confinement structure of claim 16, wherein the first and second quantum confinement structures comprise three level energy state systems.

19. The coupled asymmetric quantum confinement structure of claim 16, wherein the asymmetric gate voltage influences of the optical signal.

\* \* \* \* \*

UNITED STATES PATENT AND TRADEMARK OFFICE
CERTIFICATE OF CORRECTION

PATENT NO. : 8,558,257 B2  
APPLICATION NO. : 12/625314  
DATED : October 15, 2013  
INVENTOR(S) : Ahn Page 1 of 2

It is certified that error appears in the above-identified patent and that said Letters Patent is hereby corrected as shown below:

On the Title Page, in Item (56), under "OTHER PUBLICATIONS", in Column 2, Line 10, delete "et al," and insert -- et al., --, therefor.

On the Title Page, in Item (56), under "OTHER PUBLICATIONS", in Column 2, Lines 13-14, delete "Quatum-Well" and insert -- Quantum-Well --, therefor.

In the Drawings

In Fig. 6, Sheet 5 of 5, delete "uP/uC/DSP" and insert -- μP/μC/DSP --, therefor, as shown on the attached page 2 of 2, showing Fig. 6.

In Fig. 6, Sheet 5 of 5, in Box "(615)", in Line 1, delete "Memory Controler" and insert -- Memory Controller --, therefor, as shown on the attached page 2 of 2, showing Fig. 6.

Signed and Sealed this  
Twenty-first Day of October, 2014

Michelle K. Lee  
*Deputy Director of the United States Patent and Trademark Office*